(12) United States Patent
Huott et al.

(10) Patent No.: US 10,371,747 B2
(45) Date of Patent: Aug. 6, 2019

(54) PHYSICALLY AWARE SCAN DIAGNOSTIC LOGIC AND POWER SAVING CIRCUIT INSERTION

(71) Applicant: INTERNATIONAL BUSINESS MACHINES CORPORATION, Armonk, NY (US)

(72) Inventors: William V. Huott, Holmes, NY (US); Ankit N. Kagliwal, Maharashtra (IN); Mary P. Kusko, Hopewell Junction, NY (US); Robert C. Redburn, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/291,269

(22) Filed: Oct. 12, 2016

(65) Prior Publication Data

US 2017/0254850 A1 Sep. 7, 2017

Related U.S. Application Data

(63) Continuation of application No. 15/057,240, filed on Mar. 1, 2016.

(51) Int. Cl.
*G06F 11/22* (2006.01)
*G06F 17/50* (2006.01)
(Continued)

(52) U.S. Cl.
CPC ... *G01R 31/31721* (2013.01); *G01R 31/3177* (2013.01); *G01R 31/31704* (2013.01);
(Continued)

(58) Field of Classification Search
CPC . H04L 1/24; G06F 21/6218; G06F 17/30345; G06F 17/30477;
(Continued)

(56) References Cited

U.S. PATENT DOCUMENTS

| 2004/0015803 A1* | 1/2004 | Huang | G01R 31/31859 716/103 |
| 2006/0036976 A1* | 2/2006 | Cohn | G06F 17/505 716/119 |

(Continued)

OTHER PUBLICATIONS

Huott et al., U.S. Appl. No. 15/057,240; entitled: "Physically Aware Scan Diagnostic Logical and Power Saving Circuit Insertion", filed on Oct. 13, 2016.

(Continued)

*Primary Examiner* — Binh C Tat
(74) *Attorney, Agent, or Firm* — Cantor Colburn LLP; William Kinnaman

(57) ABSTRACT

Aspects include a computer-implemented method for scan diagnostic logic circuit insertion in a circuit design topology. A method includes evaluating a scan chain of the circuit design topology, the scan chain comprising a plurality of scan latches and a plurality of physical structures, the evaluating including identifying the plurality of physical structures in the scan chain. The method also includes identifying one of the plurality of physical structures as a physical structure of interest, and responsive to the identification of the physical structure of interest, targeting the physical structure of interest, the targeting comprising inserting scan diagnostic logic at a location in the scan chain that is based on a location of the physical structure of interest in the scan chain.

9 Claims, 5 Drawing Sheets

(51) Int. Cl.
*G01R 31/317* (2006.01)
*G01R 31/3177* (2006.01)

(52) U.S. Cl.
CPC ..... *G01R 31/31723* (2013.01); *G06F 17/505* (2013.01); *G06F 17/5068* (2013.01)

(58) Field of Classification Search
CPC ......... G06F 17/30539; G06F 17/30572; G06F 17/30589; G06F 21/6209; G06F 17/30289; G06F 2221/2111; G06F 2221/2113; G06F 11/2094; G06F 17/30699; G06F 21/554; G06F 21/62; G06F 21/6245; G06F 21/6254; G06F 21/6263; G06F 21/6272; G06F 11/2007; G06F 17/30672; G06F 3/0321; G06F 3/03545; G06F 17/5022; G06F 17/5045; G06F 2217/66; G06F 17/505; G06F 17/5068; B29C 33/3835; H04N 1/00358; H04N 1/32778; H01L 2224/73265; H01L 2224/73253; H01L 2224/80001; H01L 21/743; H01L 27/112; H01L 27/11529; H01L 2924/3025

USPC .................................. 716/136–139, 100–106
See application file for complete search history.

(56) References Cited

U.S. PATENT DOCUMENTS

| | | | | |
|---|---|---|---|---|
| 2008/0005710 A1* | 1/2008 | Fomaciari | ........... | G06F 17/5031 716/102 |
| 2009/0288045 A1* | 11/2009 | Chien | ................... | G06F 17/505 716/103 |
| 2010/0017760 A1* | 1/2010 | Kapur | ............. | G01R 31/31854 716/132 |

OTHER PUBLICATIONS

Huott et al., U.S. Appl. No. 15/057,240; entitled: "Physically Aware Scan Diagnostic Logical and Power Saving Circuit Insertion", filed on Mar. 1, 2016.

List of IBM Patents or Patent Applications Treated as Related; (Appendix P), Filed Oct. 12, 2016; 2 pages.

* cited by examiner

US 10,371,747 B2

PHYSICALLY AWARE SCAN DIAGNOSTIC LOGIC AND POWER SAVING CIRCUIT INSERTION

DOMESTIC PRIORITY

This application is a continuation application of the legally related U.S. Ser. No. 15/057,240 filed Mar. 1, 2016, the contents of which are incorporated by reference herein in their entirety.

BACKGROUND

The present disclosure relates generally to circuit design testing, and more specifically, to a physically aware scan diagnostic and power saving circuit insertion.

A scan chain is a technique used in design for testing the topology of an integrated circuit (IC) in order to make testing easier by providing a simple way to set and observe every flip-flop/latch in the IC. Scan diagnostic logic insertion is generally required in order to diagnose failing scan chains, and scan fails are a significantly large percentage of IC fails throughout the life of the product. Difficulties in isolating specific structures arise because of the overhead required to perform the failure analysis. Resolution down to the exact failing latch position could be made possible through diagnostic logic insertion at every single latch position, but this would be inefficient and impractical. Realistically, scan diagnostic logic can only be placed on a small fraction of the existing scan nets on an IC, and for successful failure analysis, generally only a small limited area of localization is required as there are trade-offs between the diagnostic resolution size and the scan diagnostic logic overhead.

Long scan nets in the scan chain create other additional concerns during scan chain analysis. They are a significant contributor to the consumption of functional chip power when allowed to switch during the functional operation of the chip, and power is generally consumed when not in a scanning mode by these long scan nets adding to the overall inefficiency of the scan chain analysis. Additionally, long scan nets are likely to have defects due to their large critical area and the number of shapes they occupy.

SUMMARY

According to embodiments, a method, system, and computer program product for implementing scan diagnostic logic insertion in a circuit design topology. A method includes evaluating a scan chain of the circuit design topology, the scan chain comprising a plurality of scan latches and a plurality of physical structures, the evaluating including identifying the plurality of physical structures in the scan chain. The method also includes identifying one of the plurality of physical structures as a physical structure of interest, and responsive to the identification of the physical structure of interest, targeting the physical structure of interest, the targeting comprising inserting scan diagnostic logic at a location in the scan chain that is based on a location of the physical structure of interest in the scan chain.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

In accordance with embodiments of the disclosure, physically aware scan diagnostic and power saving circuit insertion is provided. Embodiments described herein include techniques for using physical awareness in the targeting of inserting scan diagnostic logic, scan isolation logic, and scan net power saving logic Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

Figure 1:
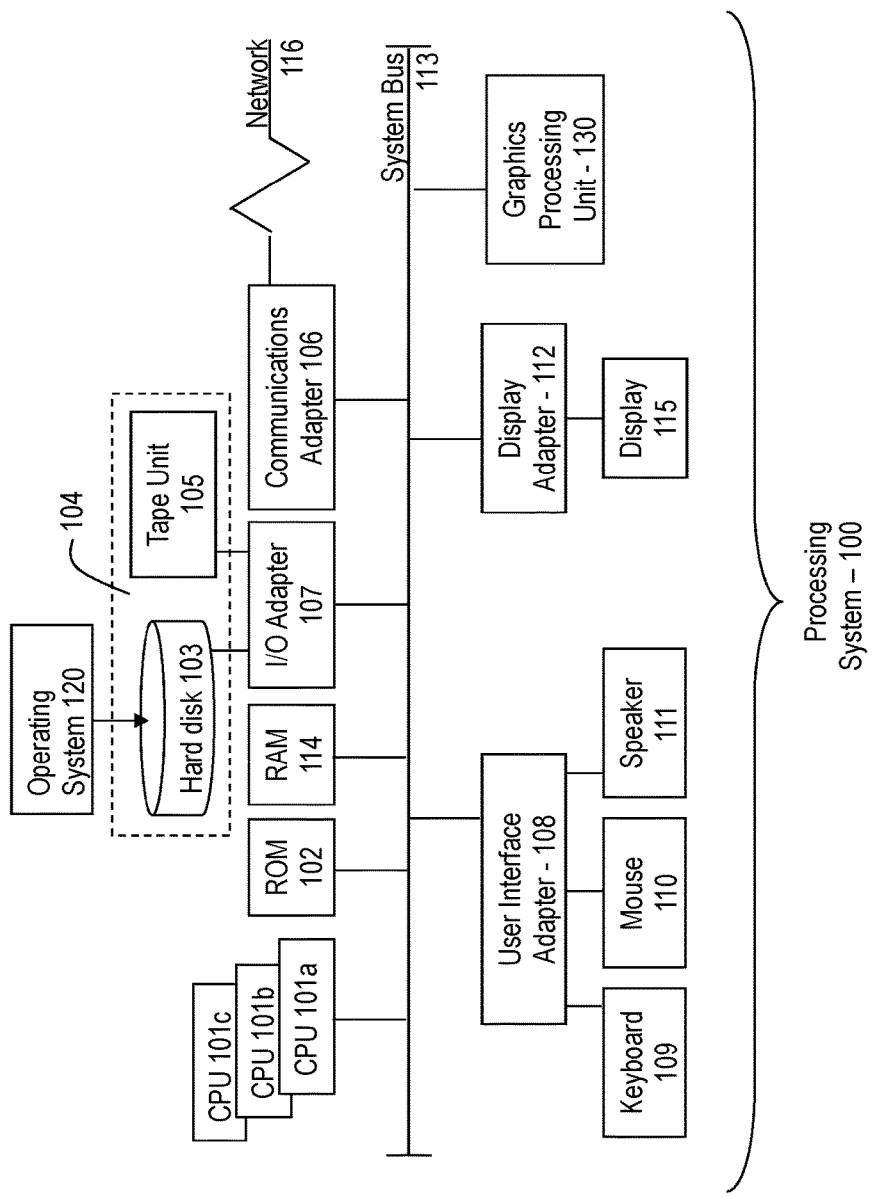
FIG. 1 is a block diagram illustrating one example of a processing system for practice of the teachings herein.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. The system 100 can be implemented in order to perform the testing of various semiconductors and IC devices.

Figure 2:
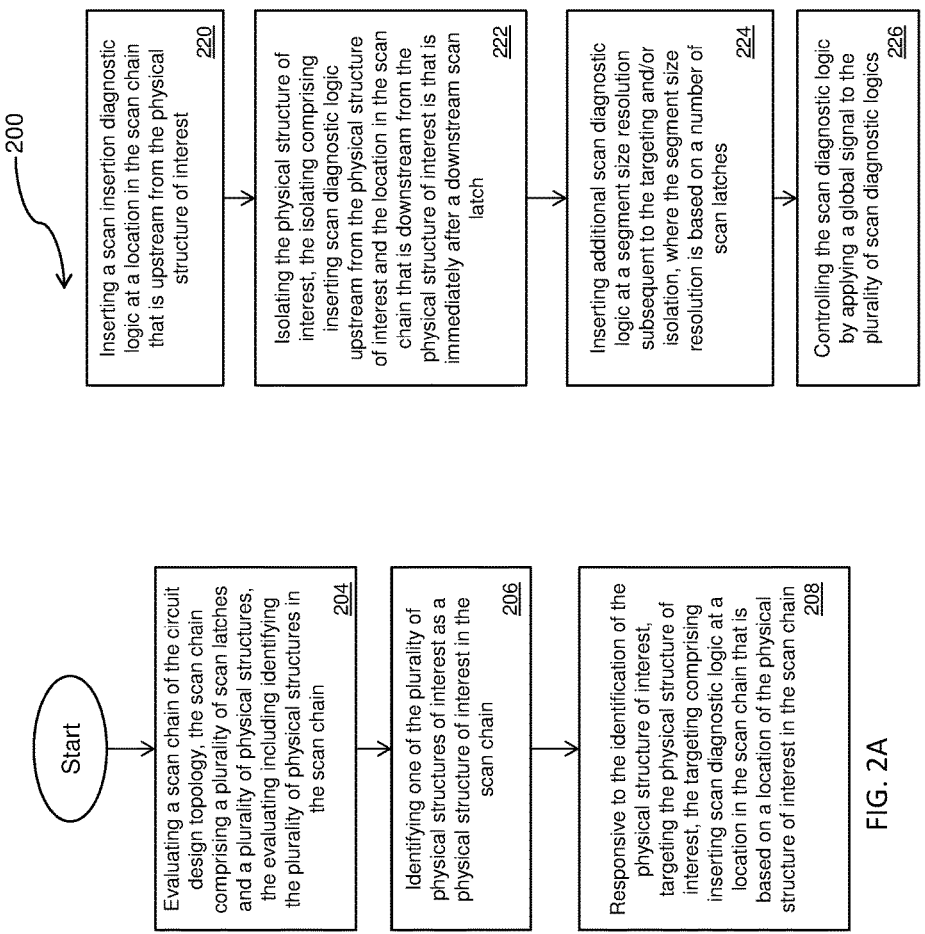
FIGS. 2A and 2B are flow diagrams for performing physically aware scan diagnostic and power saving circuit insertion in accordance with one or more embodiments.

Referring now to FIGS. 2A and 2B, a flow diagram 200 for performing physically aware scan diagnostic logic circuit insertion in a circuit topology is generally shown in accordance with an embodiment. At block 204 a scan chain of the design topology that includes a plurality of scan latches and a plurality of physical structures is evaluated, the evaluating includes identifying the plurality of physical structures in the scan chain. Block 206 shows identifying one of the plurality of physical structures of interest as a physical structure of interest in the scan chain. In an exemplary embodiment the physical structure of interest is at least one of a scan path, long scan net, a specific metal level, and a specific latch type. Scan paths include any connection between two adjacent latches. Additionally scan paths may comprise multiple scan nets and other logic devices (buffers). In an exemplary embodiment, the physical structure of interest includes scan paths. In other embodiments, the physical structure of interest may be a long scan net. The long scan nets may be selected for analysis as long scan nets are likely to have defects due to their large critical area and number of shapes they occupy. A scan net may be determined to be a long scan net based on a design metric. In an exemplary embodiment, the design metric is a configurable threshold length used to determine whether a scan net length exceeds the threshold. If it is determined that the threshold is exceeded, a scan diagnostic logic can be added at the beginning of each long scan net for power conservation, and another scan diagnostic logic can be added after the next latch in the scan chain to isolate the long scan net. Targeted insertion of a scan diagnostic logic at the beginning of these long scan nets can save the majority of scan net functional power while minimizing the circuitry requirements needed to accomplish such. Physically aware targeted scan diagnostic logic insertion can benefit chip power reduction. In other embodiments, the design metric is associated with device counts. For example, after four buffers (logic devices, latches, logic primitives, etc.) the scan insertion logic is inserted for power conservation. The design metrics as described are intended to be exemplary in nature, and are not intended to strictly limit is scope.

At block 208, responsive to the identification of the physical structure of interest at block 206, the physical structure of interest is targeted, the targeting including inserting scan diagnostic logic at a location in the scan chain that is based on a location of the physical structure of interest in the scan chain. In an exemplary embodiment the targeting includes inserting scan diagnostic logic into the scan chain where the scan diagnostic logic may be of a multiplexor configuration or a NOR/XNOR configuration. A diagnostic analysis of the scan chain is executed based on the targeted physical structure of interest and the scan diagnostic logic.

In an exemplary embodiment, targeting the physical structure of interest includes inserting a scan diagnostic logic at a location that is upstream from the physical structure of interest in the scan chain as shown in block 220 of FIG. 2B. The location upstream from the physical interest is a location occurring prior to the physical structure of interest in the scan chain. The location of the scan diagnostic logic allows the disabling of the scan chain segment to conserve power when the system is operating in a functional mode. When the circuit is operating in a functional mode, the scan diagnostic logic inserted upstream the physical structure of interest can be controlled to disable the scan chain segment including the physical structure of interest to conserve energy. Similarly the scan chain segment can be enabled using the global signals during a scan diagnostic mode. In another exemplary embodiment the selected physical structure of interest can be isolated for failure analysis. Block 222 provides isolation of the physical structure of interest by inserting a scan diagnostic logic upstream from the physical structure of interest and the location in the scan chain that is downstream from the physical structure of interest that is immediately after a downstream scan latch, where the downstream latch is one of the plurality of scan latches of the scan chain. The location downstream the physical structure of interest occurs at a location after the physical structure of interest in the scan chain that is opposite the upstream direction. The downstream scan latch is located adjacent to the physical structure of interest.

In an exemplary embodiment, further granularity in testing may be desired, and FIG. 2B at block 224 provides for inserting additional scan diagnostic logic at a segment size resolution subsequent to the targeting and/or isolation of the physical structure of interest, wherein the segment size resolution is based on a number of scan latches. In an exemplary embodiment, the segment size is configurable. Block 226 provides for controlling the scan diagnostic logic by applying a global signal to the inserted scan diagnostic logic. In an exemplary embodiment, the global signals are signals that can be applied to one or more scan diagnostic logics in the scan chain either individually or in combination with other scan diagnostic logics. In another embodiment, the global signals include a scan input signal, scan diagnostic signal, scan disable signal, and other global signals known to one of ordinary skill in the art. In another exemplary embodiment, a scan disable signal is applied to the scan diagnostic logic to disable the scan elements in the scan chain when a scanning operation is not being executed. Since long nets use significant amounts of power and have large capacitance, the targeting of the long scan nets as the physical structure of interest may be implemented to conserve power of the circuit. When implementing the power saving feature, the technique only requires a scan insertion logic to be inserted prior to the large power burning scan nets of interest, and no further scan insertion logic is needed after the next downstream latch.

In another exemplary embodiment, isolation of the physical structure of interest may be implemented for a localized failure analysis of a scan chain segment. In a different embodiment a combination of targeting a physical structure for power conservation and isolation of the physical structure of interest can be implemented. In another exemplary embodiment the scan diagnostic logic may be inserted at a configurable segment size resolution. Any of the above techniques may be combined for performing the scan chain diagnostic.

Figure 3:
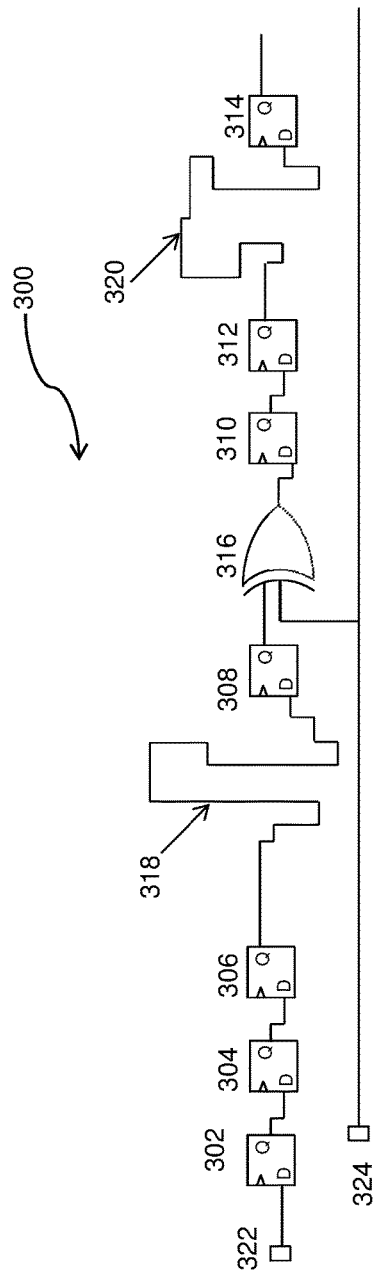
FIG. 3 is a block diagram illustrating a scan chain in accordance with one or more embodiments.

FIG. 3 shows an example of an existing scan chain 300 for performing failure analysis in accordance with an embodiment. Scan chain 300 includes a plurality of latches 302-312, where latch 302 receives an input signal 322. A scan diagnostic logic 316 is placed after every four latches, and receives as an input a scan diagnostic signal 324 for analyzing the scan chain 300. In this example the segment size resolution is based on four scan latches, which determines the placement of each of the scan diagnostic logic. Scan chain 300 further includes long scan nets 318 and 320 which consume power from the system.

Figure 4:
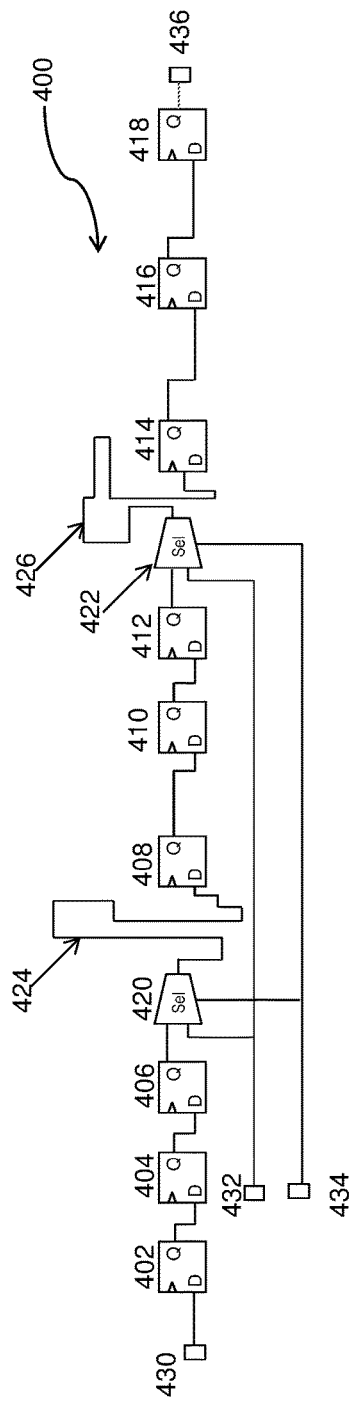
FIG. 4 is a block diagram illustrating an exemplary embodiment for physically aware scan diagnostic and power saving circuit insertion.

Referring now to FIG. 4, a scan chain 400 in accordance with an exemplary embodiment is shown. Scan chain 400 includes a plurality of latches, long scan nets, and scan diagnostic logic. Latches 402-418 are included in the scan chain where latch 402 receives an input signal 430 to the scan chain. In this exemplary embodiment, the scan diagnostic insertion logic 420 and 422 is a mux device which receives global signals such as a scan diagnostic signal 432 and a scan disable signal 434. In an exemplary embodiment the scan diagnostic logic is implemented with targeted power saving of scan chain 400. The location of the scan diagnostic logic 420 and 422 are positioned in a location to reduce power consumption. When implementing the power saving feature, a scan insertion logic is only required to be inserted prior to the physical structure of interest (large power burning scan nets) and no further scan diagnostic logic is needed after the next latch. In an exemplary embodiment, the physical structures of interests can be long scan nets 424 and 426. When power saving is implemented a scan_disable signal 434 is provided to each scan diagnostic logic (420 and 422) of the scan chain to prevent the switching of the long scan nets 424 and 426 when there is no scan chain failure analysis being performed. An output signal is provided at 436.

Figure 5:
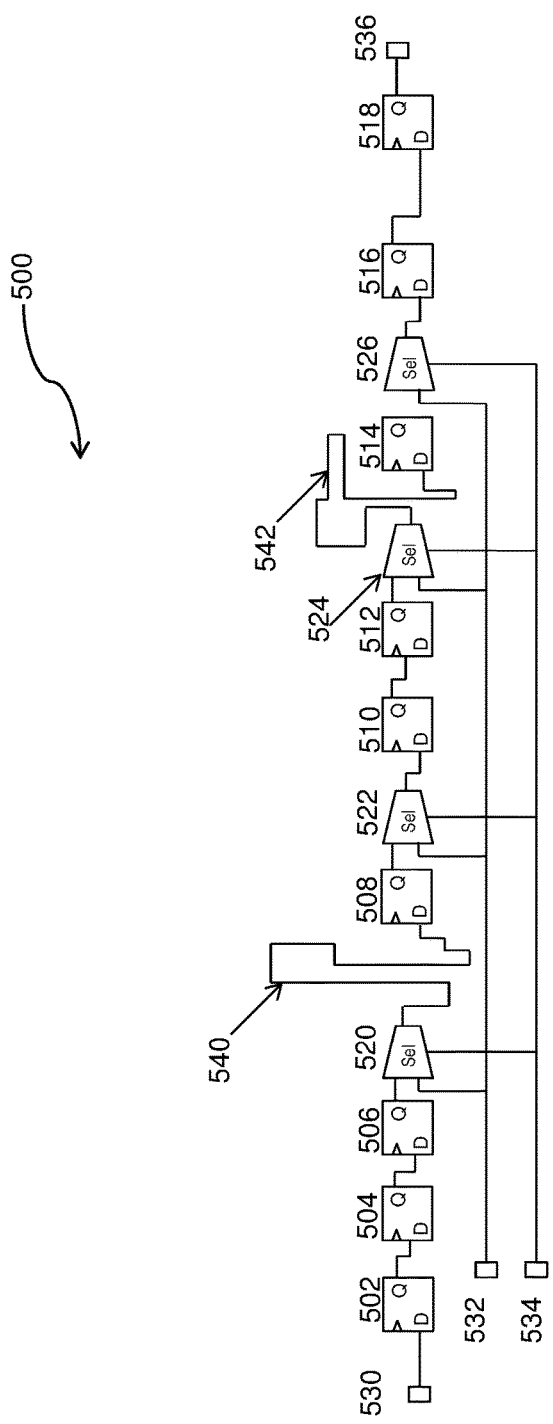
FIG. 5 is a block diagram illustrating another exemplary embodiment for physically aware scan diagnostic and power saving circuit insertion.

Now referring to FIG. 5, a scan chain 500 according to an exemplary embodiment is generally shown. The scan chain 500 includes a plurality of latches 502-518 and a plurality of scan diagnostic logics 520-526. In this exemplary embodiment, the scan diagnostic logic 520-526 is a multiplexor (mux) device. It is known to one of ordinary skill in the art that other types of scan diagnostic logic, gates, or circuits can be used. Latch 502 is configured to receive an input signal 530 and scan diagnostic logic 520-526 is configured to receive global signals including a scan_diagnostic signal 532 and a scan_disable signal 534. An output of the scan chain is provided at output 536. Scan chain 500 further includes long scan nets 540 and 542. In an exemplary embodiment, the scan diagnostic logic insertion is implemented for targeted power saving and diagnostic isolation of physical structures of interest. The long scan nets 540 and 542 consume substantial amounts of power and scan diagnostic logic 520 and 524 are inserted at the beginning of each of the long scan nets 540 and 542. In addition, the long scan nets 540 and 542 are isolated by inserting another scan diagnostic logic 522 and 526 after a next downstream latch 508 and 514, respectively. In an exemplary embodiment, the long nets 540 and 542 are analyzed for defects or failures and the scan diagnostic logic 520 and 524 are able to receive a scan_disable signal 534 to conserve power in the system when scanning is not being performed. In this manner power conservation and efficient isolation can be achieved.

Figure 6:
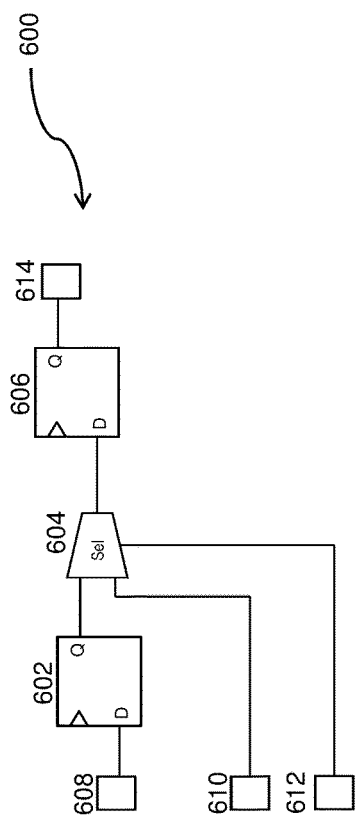
FIG. 6 is a block diagram illustrating scan diagnostic logic in accordance with one or more embodiments.

Now referring to FIG. 6 an exemplary scan diagnostic logic 600 is shown. A scan_in signal 608 is provided to an input signal latch 602, and a scan_diagnostic signal 610 is provided to a scan insertion logic mux 604. A scan_disable signal 612 is provided to disable mux 604 to conserve power when a scan diagnostic is not being executed and prevents the switching of a connected circuit element. An output 614 is provided by scan latch 606.

Figure 7:
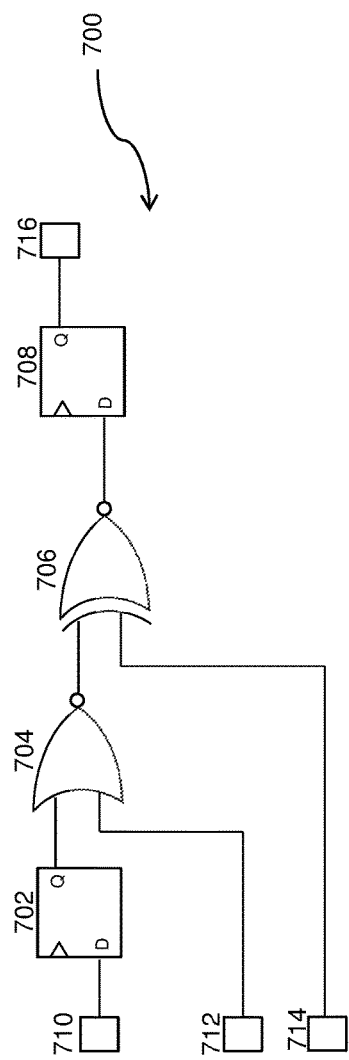
FIG. 7 is a block diagram illustrating alternative scan diagnostic logic in accordance with one or more embodiments.

FIG. 7 depicts an exemplary scan diagnostic logic NOR/XNOR configuration. Scan_in signal 710 is provided to latch 702 where latch 702 is coupled to NOR gate 704. The NOR gate 704 is further coupled to XNOR gate 706. NOR gate 704 is configured to receive a scan_disable signal 712 and XNOR gate 706 is configured to receive a scan_diagnostic signal 714. An output is provided at output 716. XNOR gate 706 is coupled to latch 708. These global signals can be invoked to control the scan diagnostic logic to implement power conservation and scan chain analysis.

Technical effects and benefits include targeted scan diagnostic logic insertion that is highly efficient in that it requires very few additional scan diagnostic logic/gates, when compared to existing methods (e.g., of only placing gating elements at an arbitrary N number of latches). Benefits can include performing a scan diagnostic operation, where a break in the scan chain located at a particular physical structure of interest can be identified down to the resolution of one latch position. High resolution at low overhead cost can be achieved for the scan chain analysis thereby improving processing time and power. Additionally, in the case of a long wire, the functional power burn caused by that long scan wire can be eliminated by using the scan diagnostic logic to block the switching of that wire during function operation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A computer-implemented method for scan diagnostic logic insertion in a circuit design topology, the method comprising:

evaluating a scan chain of the circuit design topology, the scan chain comprising a plurality of scan latches and a plurality of physical structures, the evaluating including identifying the plurality of physical structures in the scan chain;

identifying one of the plurality of physical structures as a physical structure of interest;

responsive to the identification of the physical structure of interest, targeting the physical structure of interest, the targeting comprising inserting scan diagnostic logic at a location in the scan chain that is based on a location of the physical structure of interest in the scan chain, wherein the inserted scan diagnostic logic is at least one of a multiplexor device, NOR circuit, or XNOR circuit;

disabling a segment of the scan chain associated with the targeted physical structure of interest when the circuit design topology is operating in functional mode to conserve power, wherein the disabling includes providing a scan_disable signal to at least one of the plurality of scan latches;

outputting a signal to a system, wherein the signal is based at least in part on the evaluation; and propagating results of the evaluating the scan chain to a central processing unit (CPU).

2. The method of claim 1, wherein the physical structure of interest includes is at least one of a scan path, a long scan net, a metal layer, and a specific latch type.

3. The method of claim 1, the scan diagnostic logic is inserted at a location in the scan chain that is upstream from the physical structure of interest.

4. The method of claim 1, further comprising isolating the physical structure of interest, the isolating comprising inserting additional scan diagnostic logic at location in the scan chain that is downstream from the physical structure of interest.

5. The method of claim 4, wherein the scan diagnostic logic is inserted at a location in the scan chain that is upstream from the physical structure of interest and the location in the scan chain that is downstream from the physical structure of interest is immediately after a downstream scan latch, wherein the downstream scan latch is one of the plurality of scan latches.

6. The method of claim 1, further comprising:
controlling the scan diagnostic logic by applying a global signal to the scan diagnostic logic to prevent switching of the physical structure of interest during functional operation.

7. The method of claim 1, wherein the physical structure of interest is identified based on a design metric.

8. The method of claim 1, further comprising, inserting additional scan diagnostic logic at a segment size resolution subsequent to the targeting of the physical structure of interest, wherein the segment size resolution is based on a number of scan latches.

9. A computer-implemented method for scan diagnostic logic insertion in a circuit design topology, the method comprising:
evaluating a scan chain of the circuit design topology, the scan chain comprising a plurality of scan latches and a plurality of physical structures, the evaluating including identifying the plurality of physical structures in the scan chain;
identifying one of the plurality of physical structures as a physical structure of interest;
responsive to the identification of the physical structure of interest, targeting the physical structure of interest;
inserting scan diagnostic logic at a location in the scan chain that is based on a location of the physical structure of interest in the scan chain, wherein the inserted scan diagnostic logic is at least one of a multiplexor device, NOR circuit, or XNOR circuit;
disabling a segment of the scan chain associated with the targeted physical structure of interest when the circuit design topology is operating in functional mode to conserve power, wherein the disabling includes providing a scan_disable signal to at least one of the plurality of scan latches;
outputting a signal to a system, wherein the signal is based at least in part on the evaluation; and
propagating results of the evaluating the scan chain to a central processing unit (CPU).

* * * * *